US008223527B2

(12) United States Patent
Lee et al.

(10) Patent No.: US 8,223,527 B2
(45) Date of Patent: Jul. 17, 2012

(54) SEMICONDUCTOR DEVICE HAVING MEMORY ARRAY, METHOD OF WRITING, AND SYSTEMS ASSOCIATED THEREWITH

(75) Inventors: Kwang Jin Lee, Hwaseong-si (KR); Qi Wang, Suwon-si (KR); Beak Hyung Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 708 days.

(21) Appl. No.: 12/289,937

(22) Filed: Nov. 7, 2008

(65) Prior Publication Data

US 2009/0141567 A1    Jun. 4, 2009

(30) Foreign Application Priority Data

Nov. 9, 2007 (KR) ................... 10-2007-0114465

(51) Int. Cl.
*G11C 7/00* (2006.01)
*G11C 11/00* (2006.01)
(52) U.S. Cl. ... 365/148; 365/163; 365/218; 365/189.16; 365/195
(58) Field of Classification Search ............ 365/148, 365/163, 185.29, 218, 189.16, 195
See application file for complete search history.

(56) References Cited

U.S. PATENT DOCUMENTS

| | | | |
|---|---|---|---|
| 5,574,876 A * | 11/1996 | Uchiyama et al. | ............... 711/5 |
| 6,351,406 B1 | 2/2002 | Johnson et al. | |
| 6,545,906 B1 | 4/2003 | Savtchenko et al. | |
| 6,849,891 B1 | 2/2005 | Hsu et al. | |
| 6,888,773 B2 | 5/2005 | Morimoto | |
| 7,061,790 B2 | 6/2006 | Morimoto et al. | |
| 7,282,759 B2 | 10/2007 | Kim et al. | |
| 2004/0114438 A1* | 6/2004 | Morimoto | ............... 365/185.29 |
| 2005/0122768 A1* | 6/2005 | Fukumoto | ............... 365/158 |
| 2006/0056233 A1 | 3/2006 | Parkinson et al. | |

* cited by examiner

*Primary Examiner* — J. H. Hur
(74) *Attorney, Agent, or Firm* — Harness, Dickey & Pierce, P.L.C.

(57) ABSTRACT

In one embodiment, the semiconductor device, includes a non-volatile memory cell array, and a control unit configured to generate a mode signal indicating if a flash mode has been enabled. A write circuit is configured to write in the non-volatile memory cell array based on the mode signal such that the write circuit disables erasing the non-volatile memory cell array if the flash mode has not been enabled and instructions to erase one or more cells of the non-volatile memory cell array is received.

15 Claims, 15 Drawing Sheets

| 10_1 | 10_2 | 10_3 | 10_4 | 10_5 | 10_6 | 10_7 | 10_8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |

SEMICONDUCTOR DEVICE HAVING MEMORY ARRAY, METHOD OF WRITING, AND SYSTEMS ASSOCIATED THEREWITH

PRIORITY INFORMATION

The subject application claims priority under 35 U.S.C. 119 on Korean application no. 2007-0114465 filed Nov. 9, 2007; the contents of which are hereby incorporated by reference in their entirety.

FIELD OF THE INVENTION

Embodiments relate to semiconductor devices having a non-volatile memory cell array. There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc.

SUMMARY OF THE INVENTION

One or more example embodiments relate to a semiconductor device.

In one embodiment, the semiconductor device, includes a non-volatile memory cell array, and a control unit configured to generate a mode signal indicating if a flash mode has been enabled. A write circuit is configured to write in the non-volatile memory cell array based on the mode signal such that the write circuit disables erasing the non-volatile memory cell array if the flash mode has not been enabled and instructions to erase one or more cells of the non-volatile memory cell array is received.

In one embodiment, the semiconductor device further includes a read circuit configured to read data from the non-volatile memory cell array. Here, the control unit is configured to control the read circuit to read data associated with an address input for a write operation during pre-read operation, and the write circuit is configured to disable writing data in memory locations of the non-volatile memory cell array storing data matching the write data during the pre-read operation based on the read data.

In another embodiment, the semiconductor device includes a non-volatile memory cell array including a first portion and a second portion. A mode control circuit is configured to generate a first mode signal indicating if a flash mode has been enabled for the first portion of the non-volatile memory cell array, and the mode control circuit is configured to generate a second mode signal indicating if a flash mode has been enabled for the second portion of the non-volatile memory cell array. A first write circuit is configured to write in the first portion of the non-volatile memory cell array based on the first mode signal such that the first write circuit disables erasing the first portion of the non-volatile memory cell array if the flash mode has not been enabled and instructions to erase one or more cells of the first portion of the non-volatile memory cell array is received. A second write circuit is configured to write in the second portion of the non-volatile memory cell array based on the second mode signal such that the second write circuit disables erasing the second portion of the non-volatile memory cell array if the flash mode has not been enabled and instructions to erase one or more cells of the second portion of the non-volatile memory cell array is received.

One or more embodiment further relate to a method of writing to a non-volatile memory cell array.

One embodiment of the method includes disabling erasing the non-volatile memory cell array if a flash mode of operation has not been enabled and instructions to erase one or more cells of the non-volatile memory cell array are received.

One or more embodiments further relate to semiconductor device implementations.

For example, one embodiment is directed to a card. The card includes a memory a control unit configured to control the memory. The memory includes a non-volatile memory cell array, and a control unit configured to generate a mode signal indicating if a flash mode has been enabled. A write circuit is configured to write in the non-volatile memory cell array based on the mode signal such that the write circuit disables erasing the non-volatile memory cell array if the flash mode has not been enabled and instructions to erase one or more cells of the non-volatile memory cell array is received.

Another implementation embodiment is directed to a system. In this embodiment, the system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array, and a control unit configured to generate a mode signal indicating if a flash mode has been enabled. A write circuit in the semiconductor device is configured to write in the non-volatile memory cell array based on the mode signal such that the write circuit disables erasing the non-volatile memory cell array if the flash mode has not been enabled and instructions to erase one or more cells of the non-volatile memory cell array is received.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EMBODIMENTS

Figure 1:
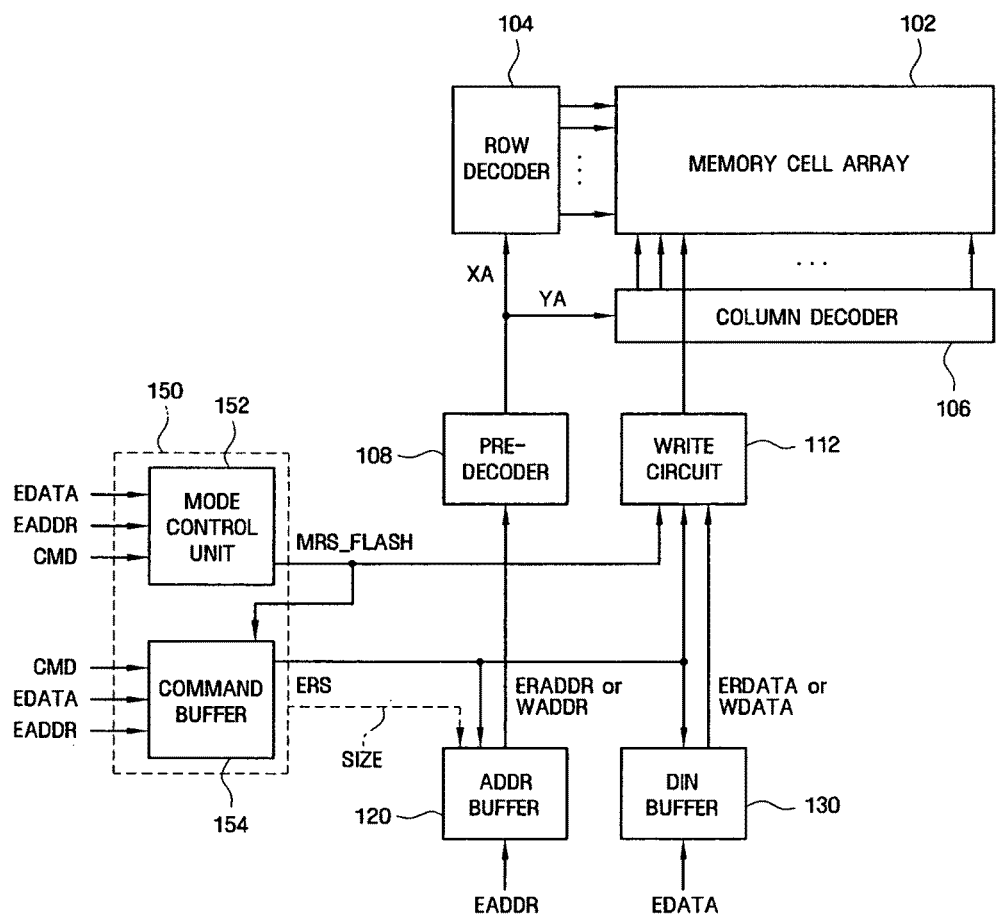
FIG. 1 illustrates a semiconductor device according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc. MRAMs use spin torque transfer phenomenon (STT). Spin torque transfer writing technology is a technology in which data is written by aligning the spin direction of the electrons flowing through a TMR (tunneling magneto-resistance) element. Data writing is performed by using a spin-polarized current with the electrons having the same spin direction. U.S. Pat. No. 6,545,906 discloses an example MRAM, and is incorporated herein by reference in its entirety.

RRAM or ReRAM takes advantage of controllable resistance changes in thin films of various resistance materials. For example, a dielectric, which is normally insulating, can be made to conduct through a filament or conduction path formed after application of a sufficiently high voltage. The conduction path formation can arise from different mechanisms, including defects, metal migration, etc. Once the filament is formed, the filament may be reset (broken, resulting in high resistance) or set (re-formed, resulting in lower resistance) by an appropriately applied voltage. During application of the appropriate voltage, resistance varies until the high resistance or low resistance state is achieved. U.S. Pat. Nos. 6,849,891 and 7,282,759 disclose example RRAMs, and are both incorporated herein by reference in their entirety.

PRAMs rely on the application of heat to phase change resistor cells to change the resistive state of the phase change resistor cells. Normally, a current is supplied to the phase change resistor cell to apply the heat. The amount and duration of the current establishes whether the phase change resistor cell achieves a low resistance state or achieves a high resistance state. The low resistive state is called a set state and may represent, for example, a logic zero state. The high resistive state is called a reset state, and may represent, for example, a logic high state. GST or a chalcogenide alloy is a common phase change material used in the phase change resistor cells.

After application of heat to effect a state change, an amount of time must pass before the phase change material stabilizes in the set or reset states. Accordingly reading from a cell prior to the cell settling in the set or reset state may result in incorrect reading of data from the memory cell array.

Figures 2, 3:
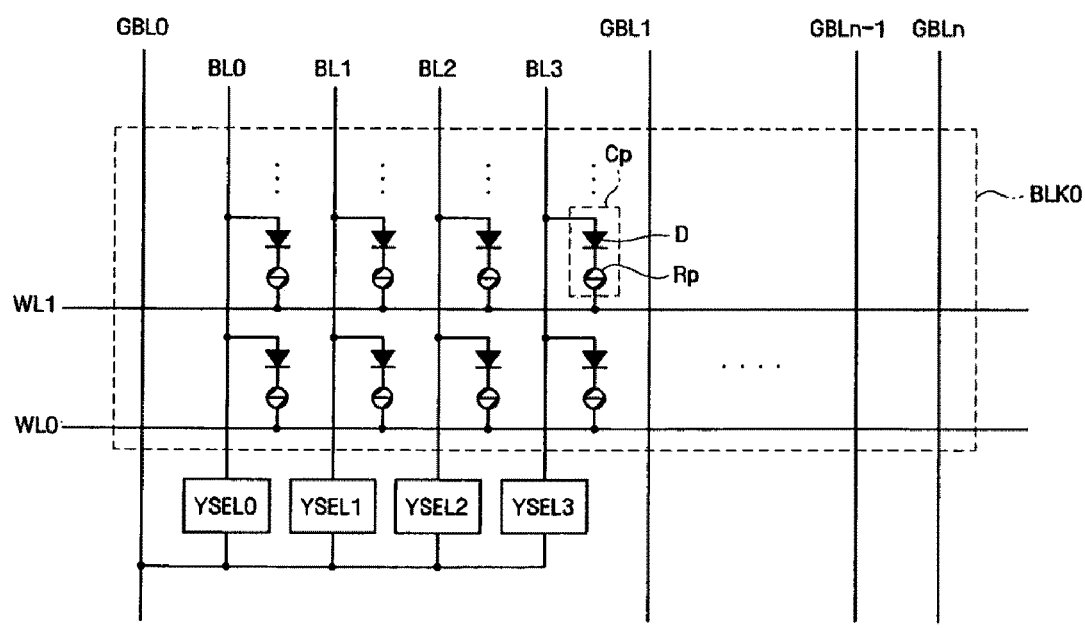
FIG. 2 illustrates a layout of the cell array in FIG. 1 according to one embodiment.
FIG. 3 illustrates a portion of memory block BLK0 in FIG. 2.

FIG. 1 illustrates a semiconductor device according to an embodiment. As shown, the semiconductor device includes a non-volatile memory cell array 102. In one embodiment, the non-volatile memory cell array 102 is a resistive material based memory cell array, but the present invention is not limited to resistive material based memory cell arrays. For the purposes of example only, the memory cell array 102 will be described as being a phase change memory cell array (PRAM); however, it will be understood that the memory cell array 102 may be any resistive material based memory array such as PRAM, RRAM, MRAM, etc. FIG. 2 illustrates a layout of the cell array 102 according to one embodiment. As shown, the memory cells in the array are divided into memory banks 10, and each memory bank 10 is divided into memory blocks BLKi. FIG. 3 illustrates a portion of memory block BLK0. It will be appreciated that the other memory blocks may be structured in the same manner. As shown, PRAM cells Cp are located at the intersections of word lines Wi (e.g., W1 and W2) and bit lines BLi (e.g., BL0, BL1, BL2, and BL3). Each PRAM cell Cp includes a current control device D and a phase change resistor cell Rp connected in series between a respective bit line BLi and a word line Wi. As shown, each current control device D is a diode, but may instead be a transistor. Furthermore, each phase change resistor cell Rp may be formed of phase change material disposed between two electrodes. The phase change material may be GeSbTe (GST), GaSb, InSb, InSe, Sb2Te3, GeTe, GeSbTe, GaSeTe, InSbTe, SnSb2Te4, InSbGe, AgInSbTe, (GeSn)SbTe, GeSb (SeTe), Te81Ge15Sb2S2, etc.

A column selector YSELi selectively connects each respective bit line BLi to a global bit line GBL0. This structure is repeated for several global bit lines GBLi. Furthermore, while only two word lines are shown, it will be appreciated that a single block BLKi may include more than two word lines, with the commensurate increase in PRAM cells Cp. Similarly, instead of four bit lines BLi being associated with each global bit line GBLi, more or less than four bit lines BLi may be associated with each global bit line GBLi.

Returning to FIG. 1, an external address EADDR is received and buffered by an address buffer 120 in association with inputs received by a control unit 150. The control unit 150 decodes the inputs into a write command, read command, etc. The control unit 150 may include a mode control unit 152 and a command buffer 154 among other conventional circuitry for controlling the semiconductor device of FIG. 1. The mode control unit 152 receives and decodes externally supplied data EDATA, a command CMD and the external address EADDR to generate a flash mode signal MRS_FLASH. The flash mode signal MRS_FLASH indicates whether the semiconductor device should operation in a flash mode or a random access memory (RAM) mode. In the flash mode, the control unit 150 controls the semiconductor device to operate in the same manner as a flash memory. In the RAM mode, the control unit 150 controls the semiconductor device to operation in the same manner as a RAM.

Figure 4:
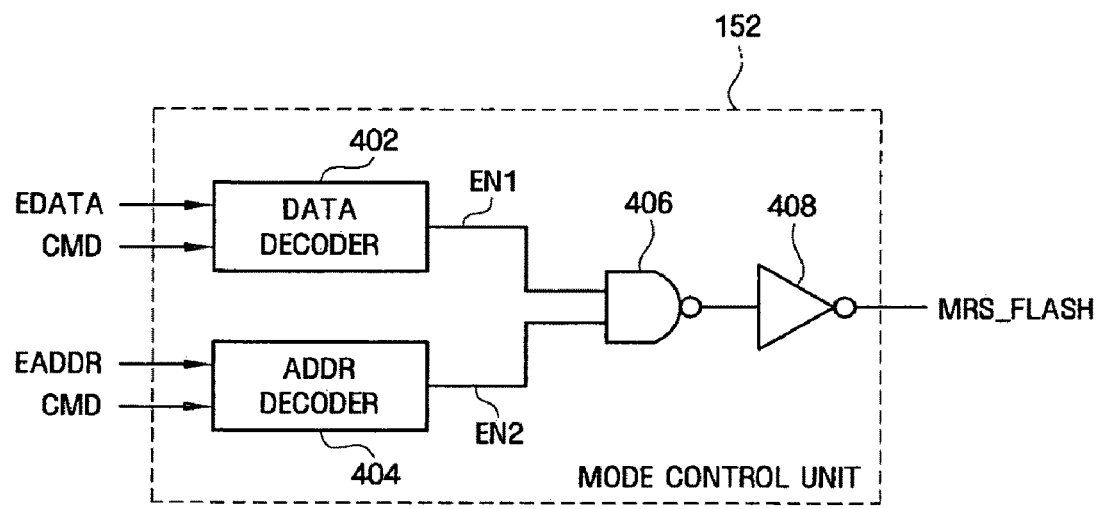
FIG. 4 illustrates an embodiment of the mode control unit of FIG. 1.

FIG. 4 illustrates an embodiment of the mode control unit of FIG. 1. As shown, the mode control unit 152 includes a data decoder 402 that decodes the externally supplied data EDATA and the command CMD into a first flash mode enable signal EN1. The mode control unit 152 also includes an address decoder 404 that decodes the external address EADDR and a subsequent command CMD into a second flash mode enable signal EN2. Namely, if the externally supplied data EDATA is a particular value and the command CMD is a particular command, then the data decoder 402 generates a logic high first flash mode enable signal EN1; otherwise, the data decoder 402 generates a logic low first flash mode enable signal EN1. For example, the externally supplied data to trigger a logic high first flash mode enable signal EN1 may be a predetermined value, and the command CMD may be a predetermined command. Similarly, if the external address EADDR is particular value and the subsequent command CMD is a particular command, the address decoder 404 generates a logic high second flash mode enable signal EN2; otherwise the address decoder 404 generates a logic low second flash mode enable signal EN2. For example, the particular address and/or command may be predetermined.

A NAND gate 406 NANDs the first and second flash mode enable signals EN1 and EN2, and an inverter 408 inverts the output of the NAND gate 406 to generate the flash mode signal MRS_FLASH. If the first and second flash mode enable signals EN1 and EN2 are both logic high then the flash mode signal MRS_FLASH is logic high. A logic high flash mode signal MRS_FLASH indicates the flash mode of operation. If one of or both of the first and second flash mode enable signals EN1 and EN2 are logic low, then the flash mode signal MRS_FLASH is logic low. A logic low flash mode signal MRS_FLASH indicates the RAM mode of operation.

Returning to FIG. 1, the command buffer 154 receives the flash mode signal as well as the externally supplied data EDATA, the command CMD and the external address EADDR to generate an erase enable signal ERS. The erase enable signal ERS indicates whether memory cells in the memory cell array 102 should be erased.

Figure 5:
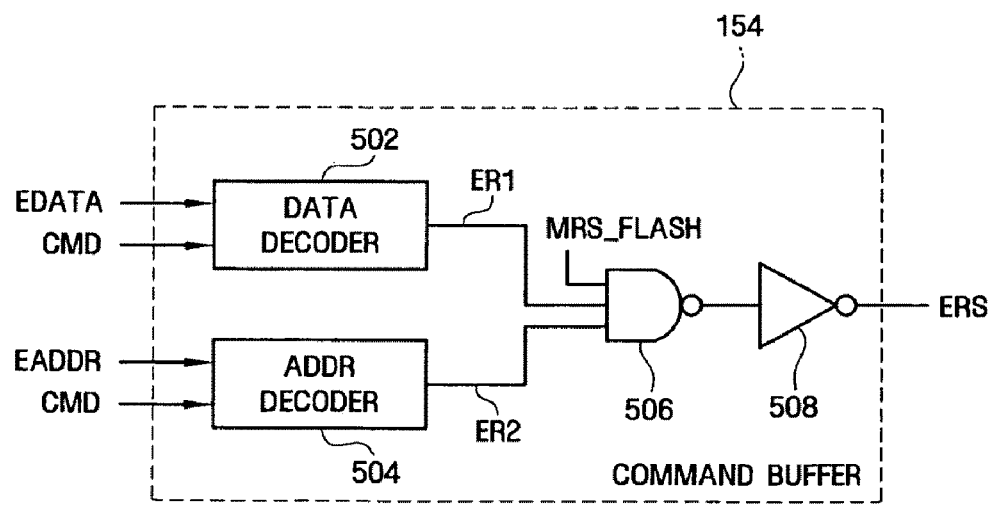
FIG. 5 illustrates an embodiment of the command buffer of FIG. 1.

FIG. 5 illustrates an embodiment of the command buffer of FIG. 1. As shown, the command buffer 154 includes a data decoder 502 that decodes the externally supplied data EDATA and the command CMD into a first erase mode enable signal ER1. The command buffer 154 also includes an address decoder 504 that decodes the external address EADDR and a subsequent command CMD into a second erase mode enable signal ER2. Namely, if the externally supplied data EDATA is a particular value and the command CMD a particular command, then the data decoder 502 generates a logic high first erase mode enable signal ER1; otherwise, the data decoder 502 generates a logic low first erase mode enable signal ER1. For example, the externally supplied data to trigger a logic high first erase mode enable signal ER1 may be a predetermined value, and the command CMD may be a predetermined command. Similarly, if the external address EADDR is particular value and the subsequent command CMD is a particular command, the address decoder 504 generates a logic high second erase mode enable signal ER2; otherwise, the address decoder 504 generates a logic low second erase mode enable signal ER2. For example, the particular address and/or command may be predetermined.

A NAND gate 506 NANDs the first and second erase mode enable signals EN1 and EN2 and the flash mode signal MRS_FLASH, and an inverter 508 inverts the output of the NAND gate 506 to generate the erase enable signal ERS. If the first and second erase mode enable signals ER1 and ER2 are both logic high and the flash mode signal MRS_FLASH is logic high (indicating the flash mode) then the erase enable signal ERS is logic high. A logic high erase enable signal ERS indicates that an erase operation is enabled. If one or more of the first and second erase mode enable signals ER1 and ER2 and the flash mode signal MRS_FLASH are logic low, then the erase enable signal ERS is logic low. A logic low erase enable signal ERS indicates that an erase operation is not enabled. Accordingly, even if an erase operation is commanded by supplying the appropriate commands CMDs, external data EDATA and external address EADDR, if the flash mode is not enabled, then the erase operation is not enabled.

Figure 6:
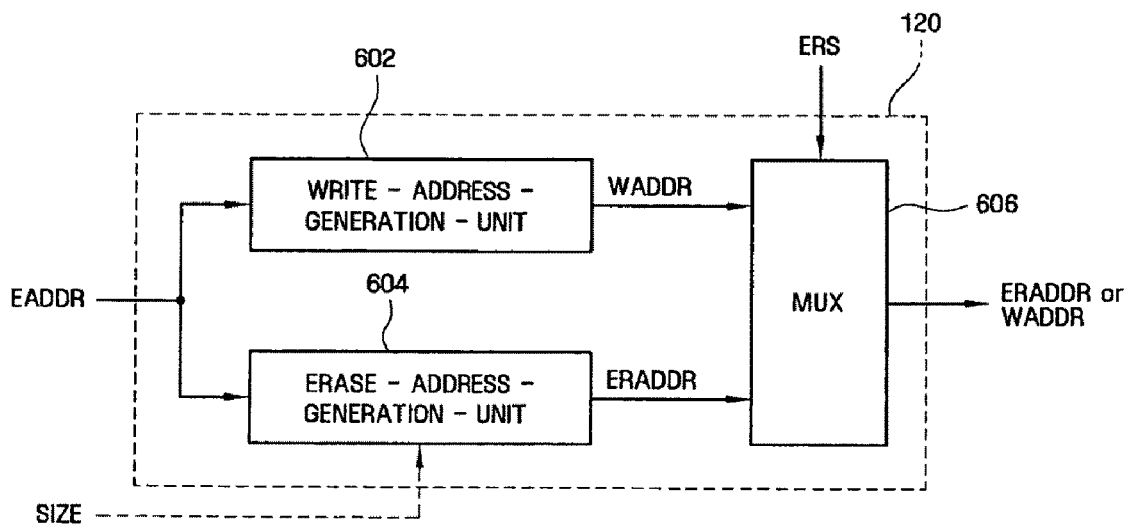
FIG. 6 illustrates an embodiment of the address buffer shown in FIG. 1.

Returning to FIG. 1, if the erase enable signal ERS indicates the erase operation is enabled, the address buffer 120 generates a sequence of erase addresses ERADDR. If the erase operation is not enabled, the address buffer 120 outputs the external address EADDR as a read or write address. FIG. 6 illustrates an embodiment of the address buffer 120 shown in FIG. 1. As shown, the address buffer 120 includes a write address generation unit 602 that generates a write address WADDR based on the external address EADDR. For example, the write address WADDR may be the external address EADDR. The address buffer 120 further includes an erase address generation unit 604 that generates a sequence of addresses referred to as erase addresses based on the external address EADDR. For example, the external address EADDR may be the first of the sequence of erase addresses ERADDR, and the other addresses in the sequence are increments thereof. For example, the length of the sequence may be set to erase a memory cell, a plurality of memory cells, a block of memory cells, more than one block of memory cells, or the entire memory cell array 102. For example, optionally, as shown by the dashed line in FIG. 1, a size signal may be sent from the control unit 150 to the address buffer 120 indicating the erase size. The erase size may indicate a memory cell, a plurality of memory cells, a block of memory cells, more than one block of memory cells, or the entire memory cell array 102. In one embodiment, the erase size signal indicates the erasure size as either a block or the entire chip (i.e., entire memory cell array 102).

A multiplexer 606 selectively outputs one of the write address WADDR and the erase addresses ERADDR based on the erase enable signal ERS. If the erase enable signal ERS indicates that an erase operation is not enabled, then the multiplexer 606 outputs the write address WADDR. However, if the erase enable signal ERS indicates that the erase operation is enabled, then the multiplexer 606 outputs the erase addresses ERADDR.

A pre-decoder 108 pre-decodes the received address or addresses into row and column addresses. A row decoder 104 further decodes the row address and selectively drives the word lines WLi in the memory cell array 102. A column decoder 106 further decodes the column address and selectively controls the column selectors YSELi to connect bit lines BLi to global bit lines GBLi.

Figure 7:
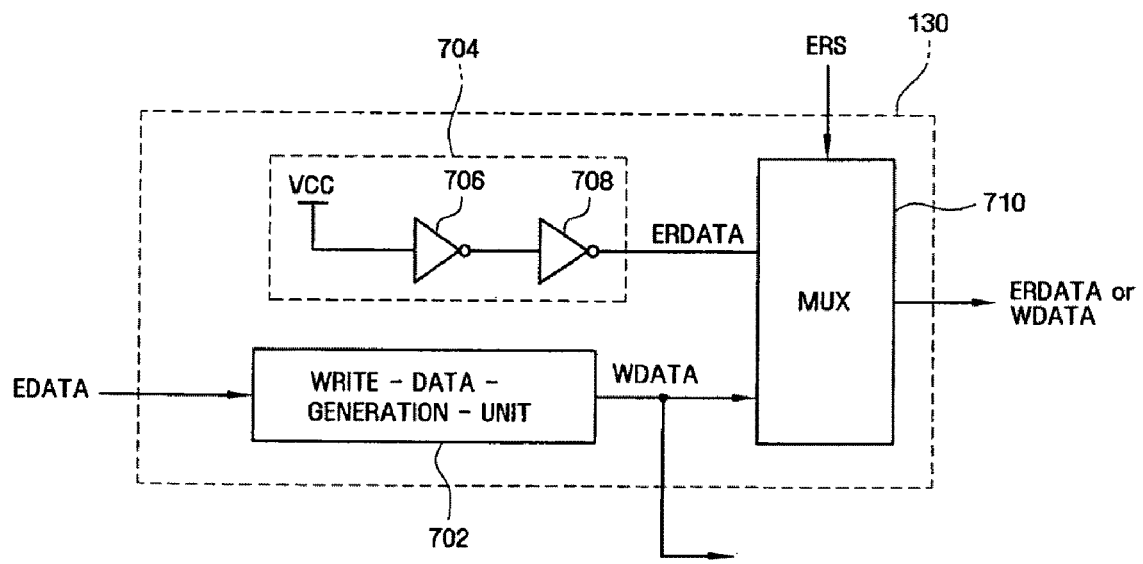
FIG. 7 illustrates an embodiment of the data input buffer in FIG. 1.

Returning to FIG. 1, a data input buffer 130 also receives the erase enable signal ERS, and selectively outputs one of the write data WDATA and erase data ERDATA to a write circuit 112. FIG. 7 illustrates an embodiment of the data input buffer 130 in FIG. 1. As shown, a write data generation unit 702 generates the write data WDATA based on the externally supplied data EDATA. For example, the write data WDATA may be the externally supplied data EDATA. The data input buffer 130 also includes an erase data generation unit 704. The erase data generation unit 704 may include inverters 706 and 708 connected in series to a supply voltage VCC. Accordingly the erase data ERDATA is logic high (e.g., logic "1"). A multiplexer 710 selectively outputs one of the erase data ERDATA and the write data WDATA based on the erase enable signal ERS. If the erase enable signal ERS indicates that an erase operation is not enabled, then the multiplexer 710 outputs the write data WDATA. If the erase enable signal ERS indicates that an erase operation is enabled, then the multiplexer 710 outputs the erase data ERDATA.

Figure 8:
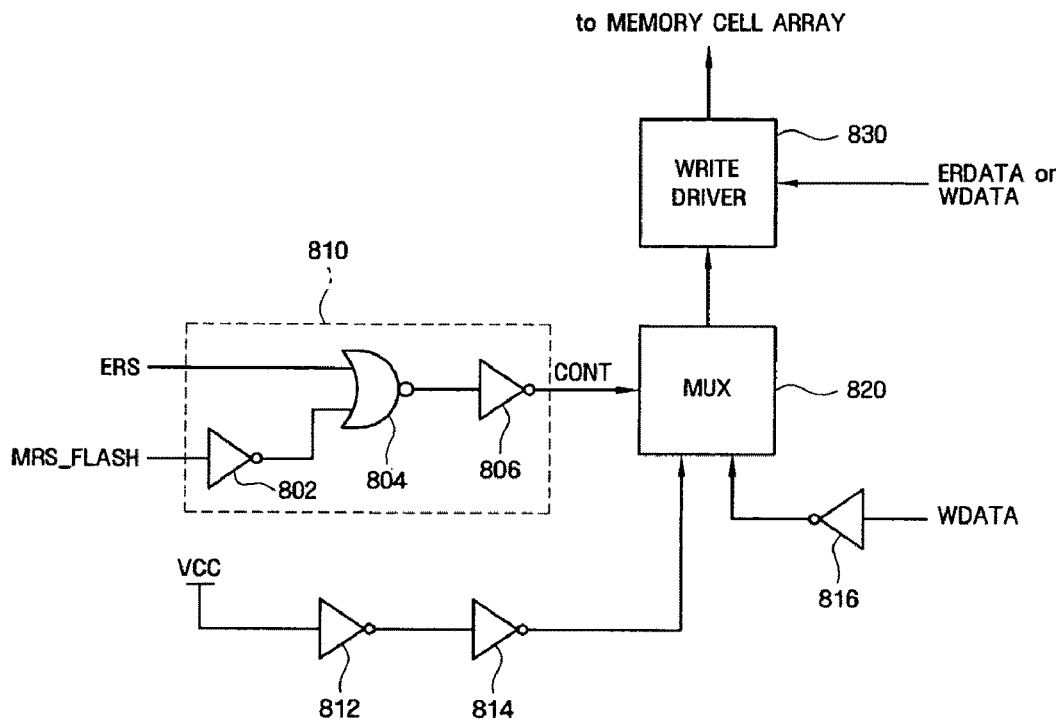
FIG. 8 illustrates an example embodiment of the write circuit in FIG. 1.

Returning to FIG. 1, the write circuit 112 receives the flash mode signal MRS_FLASH, the erase enable signal ERS and the output from the data input buffer 130, and applies appropriate currents and/or voltages to the memory cell array 102 to program or erase data stored therein. FIG. 8 illustrates an example embodiment of the write circuit in FIG. 1. As shown, a combination unit 810 receives the erase enable signal ERS and the flash mode signal MRS_FLASH, and generates a selection signal CONT. In particular, the combination unit 810 includes an inverter 802 that inverts the flash mode signal MRS_FLASH and a NOR gate 804 that NORs the output of the inverter 802 and the erase enable signal ERS. An inverter 806 inverts the output from the NOR gate 804 to generate the selection signal CONT. Accordingly, if the flash mode signal MRS_FLASH indicates the RAM mode and the erase enable signal ERS indicates that the erase operation is enabled, then the selection signal CONT will be logic high; otherwise, the selection signal CONT is logic low.

A multiplexer 820 receives the selection signal CONT, and selectively outputs based on the selection signal CONT. In particular, the multiplexer 820 receives a logic high (or logic "1" value) via two inverters 812 and 814 connected in series to the power supply voltage VCC. The multiplexer 820 also receives the write data inverted by an inverter 816. If the selection signal CONT is logic high, the multiplexer 820 outputs the logic high voltage. If the selection signal CONT is logic low, the multiplexer 820 outputs the inverted write data. A write driver 830 is enabled based on the output from the multiplexer 820 and writes the write data WDATA or erase data ERDATA output from the data input buffer 130 if enabled. Accordingly, if the RAM mode is selected or the erase operation in the flash mode is selected, then the multiplexer 820 outputs the power supply voltage VCC and the write driver 830 is constantly enabled. As such, the write driver 830 writes the write data WDATA or erase data ERDATA supplied from the data input buffer 130. However, if the flash mode is selected and a non-erase operation is selected, then the multiplexer 820 outputs the inverted write data. As a result, the write driver 830 is only enabled during a program operation (i.e., write data WDATA being logic low) in the flash mode.

Figure 9:
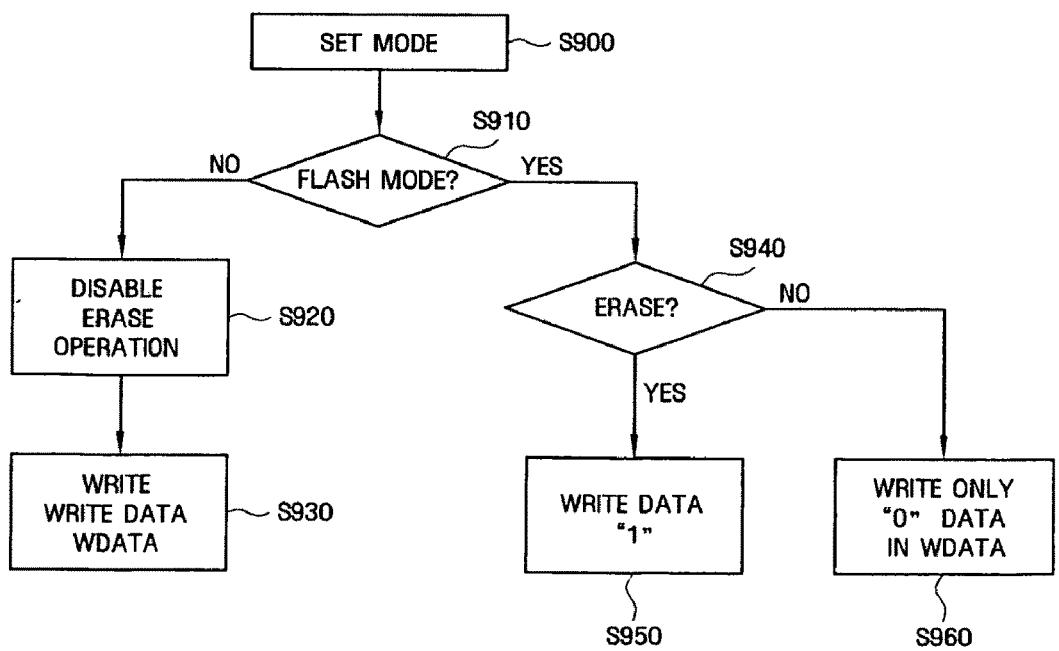
FIG. 9 illustrates a flow chart of the write operation according to an example embodiment.

FIG. 9 illustrates a flow chart of the write operation according to an example embodiment. As shown in step S900, the operation mode is set. As described above, by supplying appropriate command CMDs, external data EDATA and an external address EADDR, either the flash mode or RAM mode of operation may be selected. If the mode control unit 152 determines in step S910 that the RAM mode is selected, then in step S920 the command buffer 154 disables the erase operation. Namely, the mode control unit 152 generates a logic low flash mode signal MRS_FLASH and in response, the command buffer 154 generates a logic low erase enable signal ERS. In step S930, the write circuit 112 write the write data WDATA output from the data input buffer 130.

If the mode control unit 152 determines in step S910 that the flash mode is selected, then in step S940 the command buffer 154 determines if an erase operation is selected. If the erase operation is selected, then in step S950 the write circuit 112 writes a logic high or logic "1" into the erase addresses output by the data input buffer 130. However, if the erase operation is not selected in step S940, then in step S960 the write circuit 112 writes only the logic low or logic "0" data of the write data WDATA into the memory cell array 102.

Figure 10:
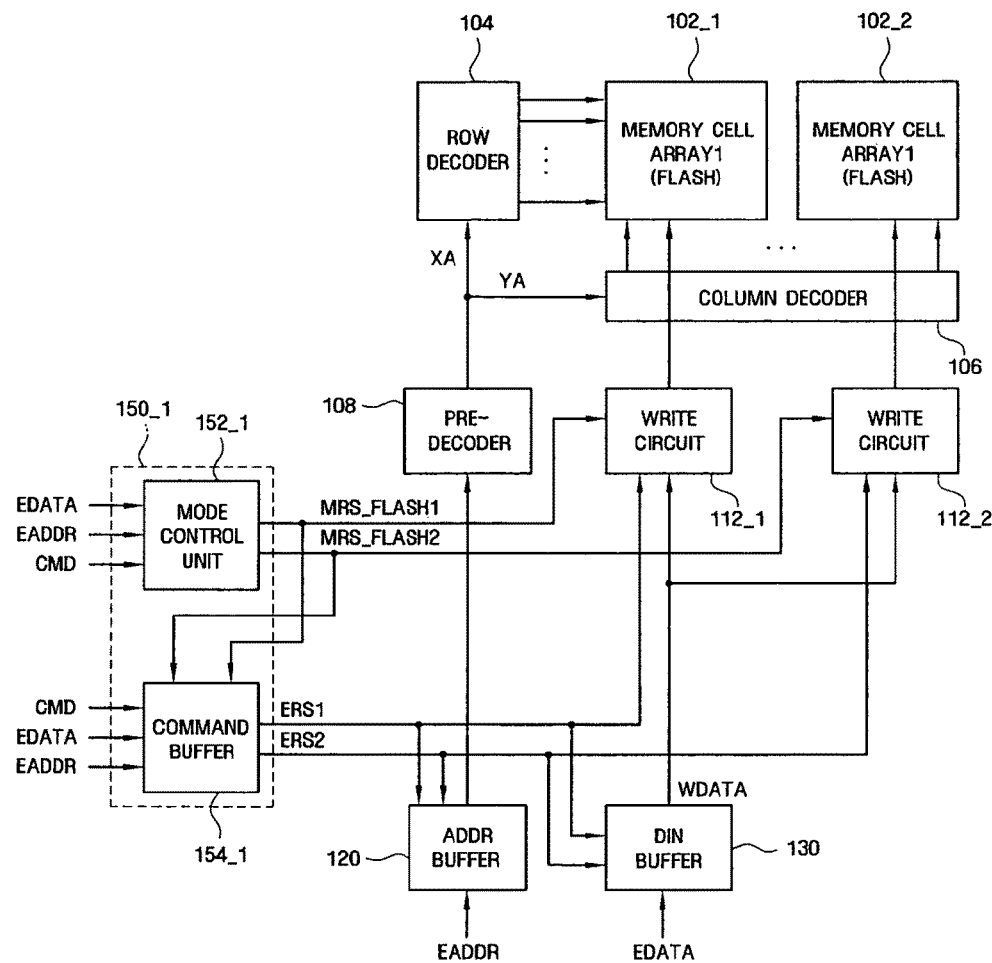
FIG. 10 illustrates another embodiment of a semiconductor device.

FIG. 10 illustrates another embodiment of a semiconductor device. This embodiment is the same the embodiment of FIG. 1, except that the embodiment includes first and second memory arrays or memory array portions 102-1 and 102-2, and associated circuitry. Namely, the embodiment of FIG. 10 includes a write circuit 112-1 for the first memory array or portion 102-1 and includes a write circuit 112-2 for the second memory array or portion 102-2. Associated therewith, the control unit 150 has been replaced with a control unit 150-1 having a mode control unit 152-1 and a command buffer 154-1.

The mode control unit 152-1 includes a first circuit having the structure of FIG. 4 for generating a first flash mode signal MRS_FLASH1 and includes a second circuit having the structure of FIG. 4 for generating the second flash mode signal MRS_FLASH2. As will be appreciated, different combinations of commands CMD, external data EDATA and external addresses EADDR may differently set the modes of the first and second flash mode signals. Furthermore, in this embodiment, only one of the first and second memory arrays or memory array portions 102-1 and 102-2 are written to at a time. Namely, the first and second flash mode signals MRS_FLASH1 and MRS_FLASH2 will not both enable the flash mode.

Similarly, the command buffer 154-1 includes a first circuit having the structure of FIG. 5 for generating a first erase enable signal ERS1 and a second circuit having the structure of FIG. 5 for generating the second erase enable signal ERS2. As will be appreciated, different combinations of commands CMD, external data EDATA and external addresses EADDR may differently set the first and second erase enable signals differently. Furthermore, because the first and second memory arrays or memory array portions 102-1 and 102-2 will not both be in the flash mode, the command buffer 154-1 may instead include only a single circuit for generating a single erase signal.

The data input buffer 130 receives the first and second erase signals ERS1 and ERS2, and applies a logical OR of the first and second erase signals ERS1 and ERS2 as the erase signal to multiplexer 130. Alternatively, if only a single erase signal is output by the command buffer 154-1, then that single erase signal will be supplied to the multiplexer 130.

Except for the differences noted above the embodiment of FIG. 10 operates in the same manner as the embodiment of FIG. 1 described above. For example, the first write circuit 112-1 operates in the same manner as described above with respect to write circuit 112 based on the first flash mode signal MRS_FLASH1 and the first erase enable signal ERS1 in writing data into the first memory array or memory array portion 102-1. Similarly, the second write circuit 112-2 operates in the same manner as described above with respect to write circuit 112 based on the second flash mode signal MRS_FLASH2 and the second erase enable signal ERS2 in writing data into the second memory array or memory array portion 102-2.

Figure 11:
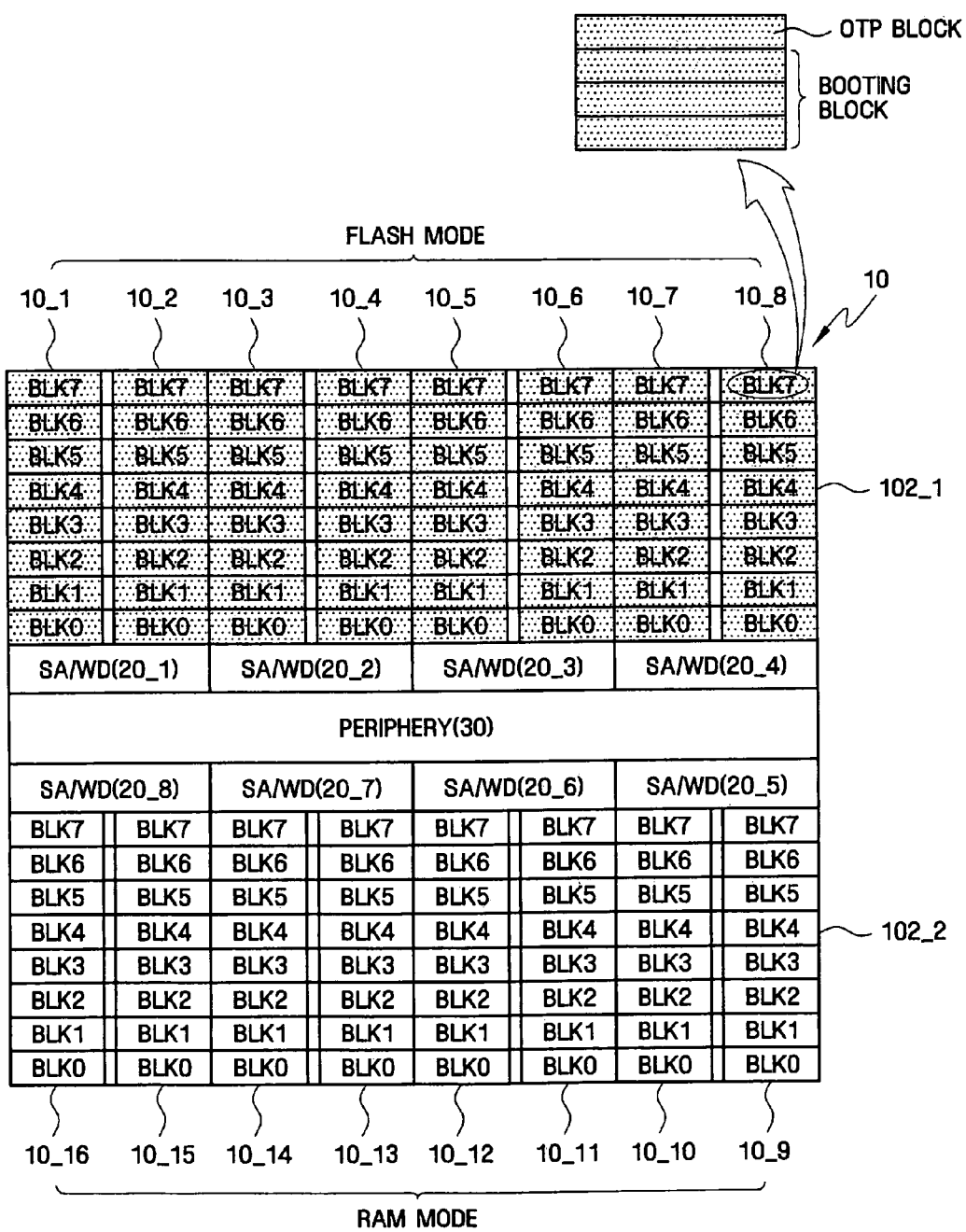
FIGS. 11 and 12 illustrates example of a memory cell array being divided into first and second portions.

In this embodiment, each memory array or portion 102-1 and 102-2 may be a single memory block BLK or multiple memory blocks. As will be appreciated, this embodiment allows different memory block or sets of memory blocks to operate in different modes (flash and RAM). For example, as shown in FIG. 11, a memory array may include a first memory array portion 102-1 and a second memory array portion 102-2 that share peripheral circuitry 30. The peripheral circuit may include the row and column decoder 104 and 106 among other things. As shown in FIG. 11, the first and second memory array portions 102-1 and 102-2 may each comprise a bank of memory blocks BLKi. The first memory array portion 102-1 may be set in the flash mode, and the second memory array portion 102-2 may be set in the RAM mode. Because the reliability of the memory operating in the flash mode is higher, the first memory array portion 102-1 may be used for storing the one time programming (OTP) and booting data, which generally comprises about one block of data.

As will be appreciated, this embodiment is not limited in application to two memory arrays or memory array portions. Instead, the principles of this embodiment may be expanded for a greater number of memory arrays or memory array portions.

Figure 12:
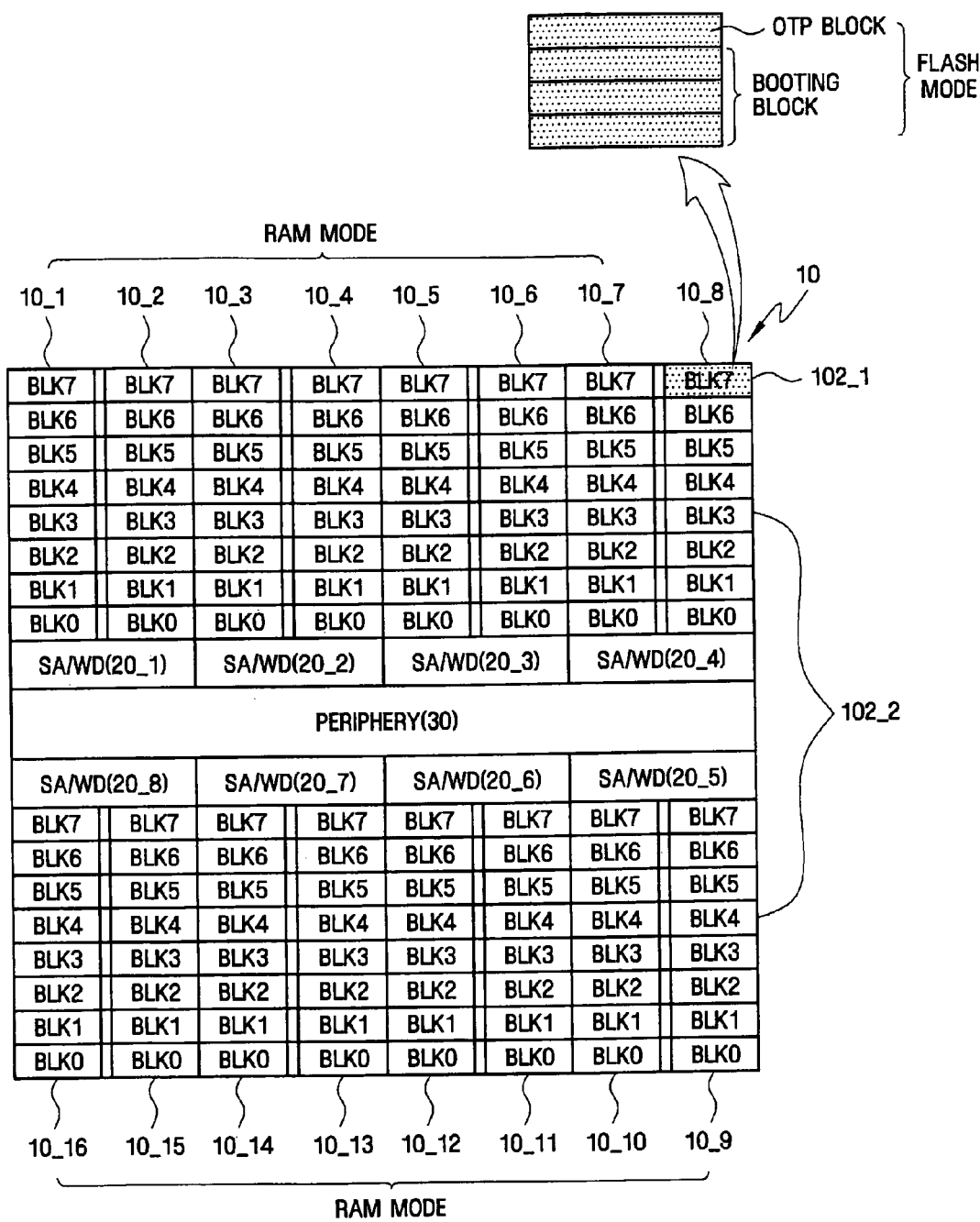

FIG. 12 illustrates another example in which the first memory array portion 102-1 is a single block and the remaining blocks form a second memory array portion 102-2. The first memory array portion 102-1 may be set in the flash mode, and the second memory array portion 102-2 may be set in the RAM mode. Because the reliability of the memory operating in the flash mode is higher, the first memory array portion 102-1 may be used for storing the one time programming and booting data, which generally comprises about one block of data. As will be appreciated, this embodiment is not limited in application to two memory arrays or memory array portions. Instead, the principles of this embodiment may be expanded for a greater number of memory arrays or memory array portions.

Figure 13:
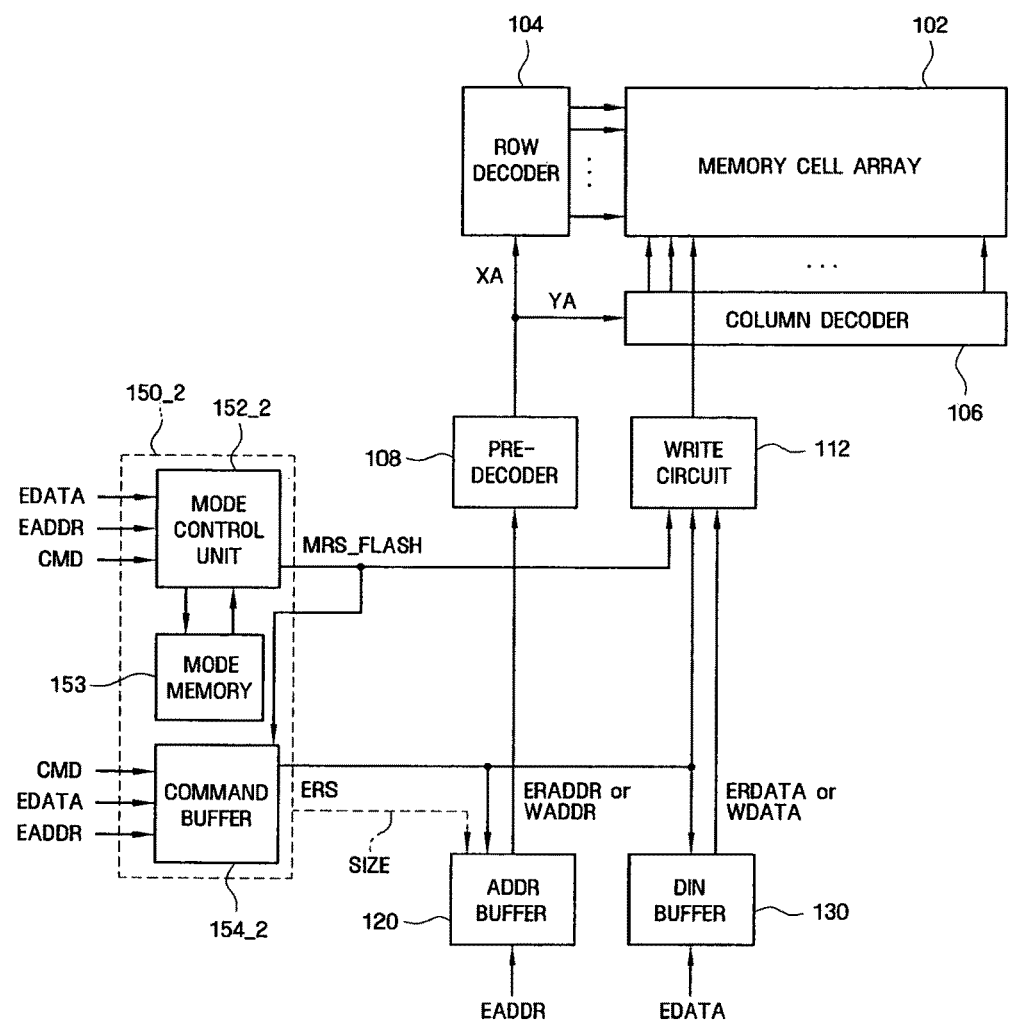
FIG. 13 illustrates further embodiment of a semiconductor device.

FIG. 13 illustrates another embodiment of a semiconductor device. The embodiment of FIG. 13 is the same as the embodiment of FIG. 1 except that the control unit 150 has been replaced with a control unit 150-2. Accordingly, for the sake of brevity, only the differences between this embodiment and the embodiment of FIG. 1 will be described.

As shown, the control unit 150-2 includes a mode control unit 152-2, a mode memory 153 and a command buffer 154. The mode control unit 152-2 receives command CMDs, the externally supplied data EDATA, and the external address EADDR and decodes whether the flash mode or RAM mode is indicated such as described above. Then, the command buffer 154 receives an external address EADDR to which the indicated mode applies. The command buffer 154 writes the indicated mode in the mode memory 153 for the indicated received external address EADDR. In particular, the mode memory 153 stores a flag for each memory unit of the memory cell array 102. A memory unit may be a memory cell, a block of memory cells, a set of blocks such as a bank, etc. The flag indicates whether the memory unit is set to the flash mode or the RAM mode. For example, if the flag is a logic "1", this indicates the memory unit is in the flash mode, and if the flag is logic "0" this indicates the memory unit is in the RAM mode. As will be appreciated, the mode memory 153 may be registers, a non-volatile memory, etc.

During operation, the mode control unit 152-2 receives the external address associated with a write operation, and accesses the flag for the received external address from the mode memory 153. If the accessed flag is logic "1", the mode control unit 152-2 outputs a logic high (or logic "1") flash mode signal MRS_FLASH indicating the flash mode. If the accessed flag is logic "0" the mode control unit 152-2 outputs a logic low (or logic "0") flash mode signal MRS_FLASH indicating the RAM mode.

The command buffer 154 and the remainder of the semiconductor device illustrated in FIG. 13 operate in the same manner as describe above with respect to FIG. 1. Therefore this description will not be repeated for the sake of brevity.

As will be appreciated, through the use of the mode memory 153, this embodiment permits the same control over which memory arrays or portions of a memory array operate in the flash mode or RAM mode as described above with respect to FIGS. 11 and 12.

Figure 14:
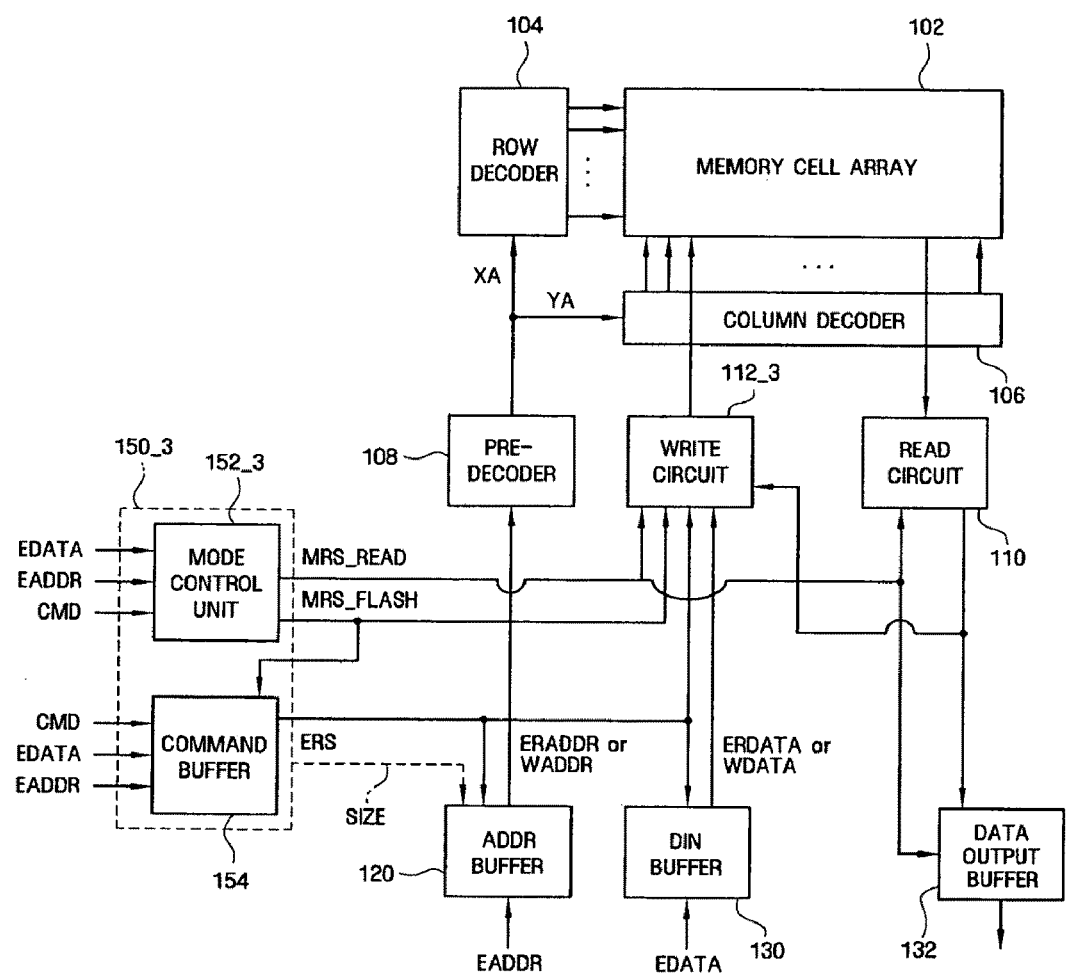
FIG. 14 illustrates an additional embodiment of a semiconductor device.

FIG. 14 illustrates another embodiment of a semiconductor device. This embodiment is the same as the embodiment of FIG. 1 except that the control unit 150 has been replaced by a control unit 150-3, the write circuit 112 has been replaced by a write circuit 112-3, a read circuit has been added, and a data output buffer has been added. Accordingly, for the sake of brevity, only the differences between this embodiment and the embodiment of FIG. 1 will be described.

The control unit 150-3 is the same as the control unit 150 except that the mode control unit 152 has been replaced with a mode control unit 152-3. The mode control unit 152-3 operates in the same manner as the mode control unit 152, but also includes the additional functionality of generating a pre-read enable signal MRS_READ. The pre-read enable signal MRS_READ indicates whether a pre-read operation is enabled or not. As will be discussed in greater detail below, the pre-read operation results in reading data from the memory cell array 102 at the address or addresses output from the address buffer 120 prior to writing data in those addresses during a write operation. The read data is compared to the write data to determine matches, and portions of the memory cell array 102 already storing data matching the write data do not undergo the write operation. This operation will be described in greater detail below with respect to the write circuit 112-3.

Returning to the mode control unit 152-3, as with setting the flash or RAM mode, the mode control unit 152-3 receives command CMDs, the externally supplied data EDATA, and the external address EADDR that may indicate whether the pre-read operation is enabled or disabled. If enabled, the mode control unit 152-3 generates a logic high (or logic "1") pre-read enable signal MRS_READ during a write operation to indicate the pre-read operation is enabled. If the pre-read operation is enabled, but a write operation is not being performed (e.g., during a read operation), the mode control unit 152-3 generates a logic low (or logic "0") pre-read enable signal MRS_READ indicating that the pre-read operation is disabled. Also, if the pre-read operation is disabled, the mode control unit 152-3 generates a logic low (or logic "0") pre-read enable signal MRS_READ indicating the pre-read operation is disabled regardless of whether a write operation is being performed.

If the control unit 150-3 receives a read command, the control unit 150-3 instructs the read circuit 110 to apply appropriate currents/voltages to the memory cell array 102 to read data from the memory cell array 102; namely, to read data from the portion of the memory cell array addressed by the received external address. The data output from the read unit 110 is buffered in a data output buffer 132. As alluded to above, the read unit 110 also performs the read operation in response to a pre-read enable signal MRS_READ indicating that pre-read operation is enabled, and the read data RDATA is supplied to the write circuit 112-3.

The data output buffer 132 selectively outputs the read data RDATA from the read unit 110 based on a pre-read enable signal MRS_READ from the control unit 150. Namely, if the pre-read enable signal MRS_READ indicates the pre-read operation is enabled, the data output buffer 132 does not output the data read by the read unit 110. However, if the pre-read enable signal MRS_READ indicates the pre-read operation is disabled, the data output buffer 132 will output data from the read unit 110.

Figure 15:
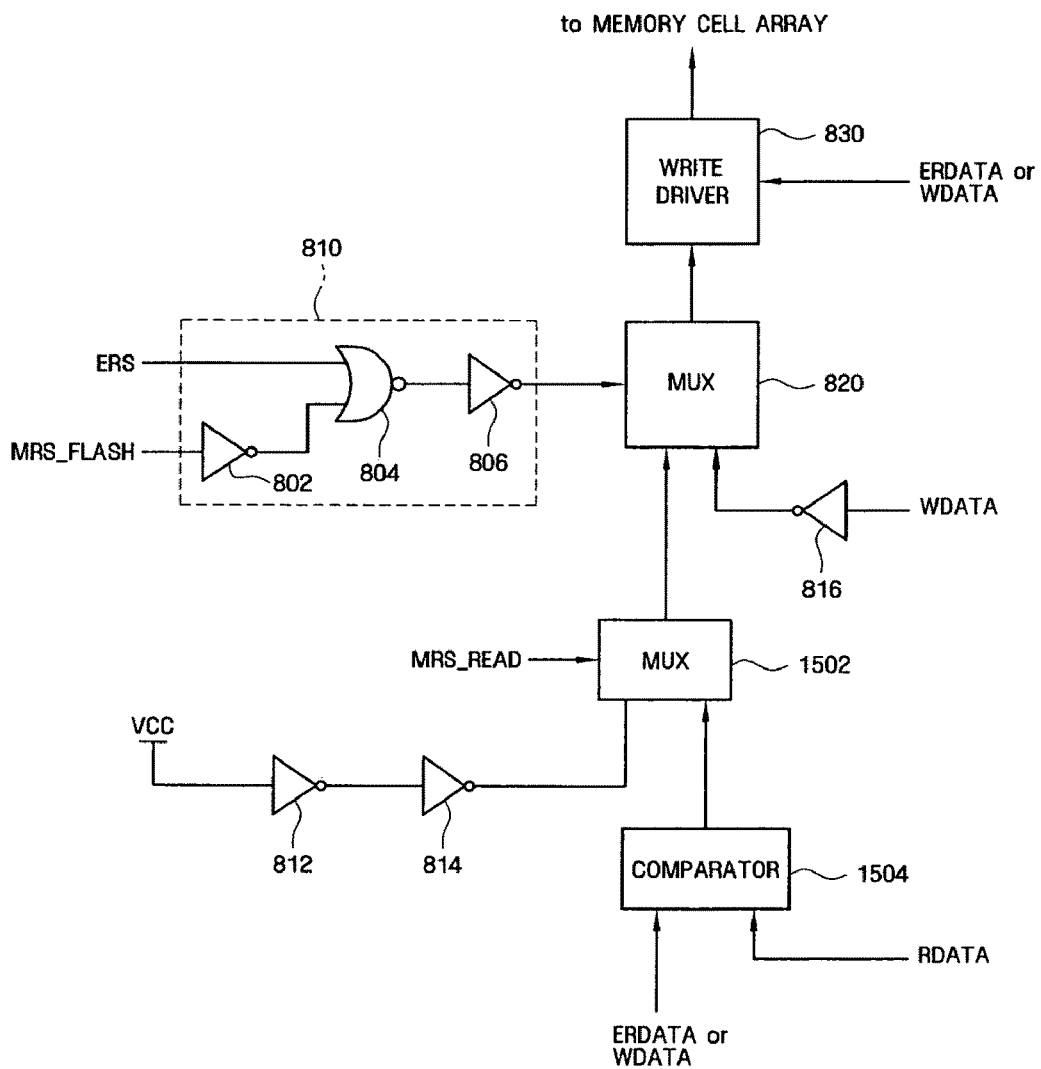
FIG. 15 illustrates an embodiment of the write circuit in FIG. 14.

Next, pre-read operation will be described in greater detail with respect to FIG. 15. FIG. 15 illustrates an embodiment of the write circuit 112-3 of FIG. 14. As shown, the write circuit 112-3 is the same as the write circuit 112 illustrated in FIG. 8 except for the addition on the multiplexer 1502 and the comparator 1504. Accordingly, for the sake of brevity, only the differences between this embodiment and the embodiment of FIG. 8 will be described.

As shown in FIG. 15, the comparator 1504 compares the read data RDATA output from the read circuit 110 to the data (write data WDATA or erase data ERDATA) output from the data input buffer 130. If the comparator 1504 determines a match, the comparator 1504 generates a logic low (or logic "0") output; otherwise, the comparator 1504 generates a logic high (or logic "1") output.

The multiplexer 1502 selectively outputs one of the power supply voltage VCC output from the inverter 814 and the output of the comparator 1504 based on the pre-read enable signal MRS_READ. If the pre-read enable signal MRS_READ indicates the pre-read operation is disabled, then the multiplexer 1502 outputs the power supply voltage VCC. Accordingly, if the pre-read enable signal MRS_READ indicates the pre-read operation is disabled, the write circuit 112-3 operates in the same manner as the write circuit 112 described above with respect to FIG. 8.

If the pre-read enable signal MRS_READ indicates the pre-read operation is enabled, then the multiplexer 1502 outputs the output from the comparator 1504. Accordingly, if the RAM mode is selected or the erase operation in the flash mode is selected, then the multiplexer 820 outputs the output from the comparator 1504. As such, the write driver 830 is enabled to write the write data WDATA or erase data ERDATA supplied from the data input buffer 130 if the read data RDATA does not match the write data WDATA or erase data ERDATA. However, if the read data RDATA does match the write data WDATA or erase data ERDATA, the write driver 830 is not enabled to perform a write operation. Namely, data stored in the memory cell array 102 is not over-written with the same data.

Figure 16:
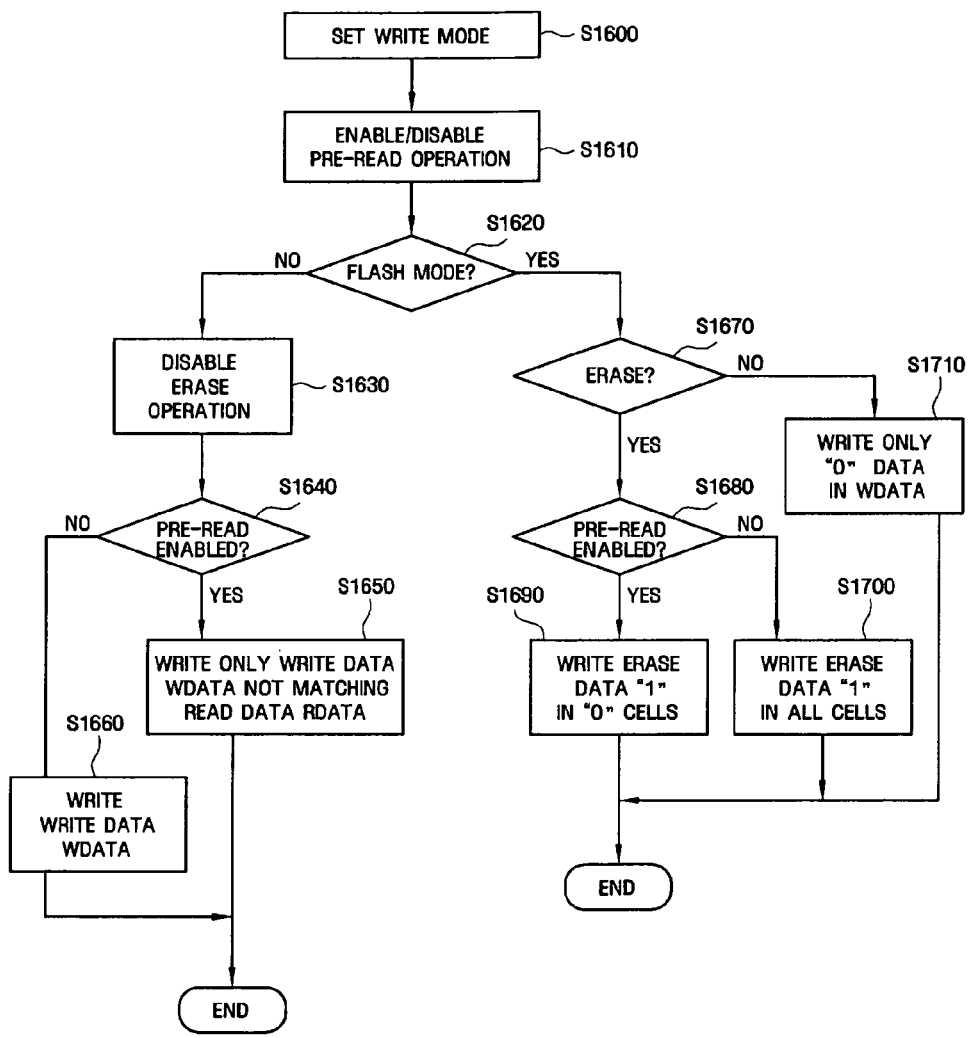
FIG. 16 illustrates a flow chart of the write operation according to an example embodiment.

FIG. 16 illustrates a flow chart of the write operation according to this embodiment. As shown, in step S1600, the operation mode is set. As described above, by supplying appropriate command CMDs, external data EDATA and an external address EADDR, either the flash mode or RAM mode of operation may be selected. Similarly, in step S1610, by supplying appropriate command CMDs, external data EDATA and an external address EADDR, pre-read operation may be enabled or disabled. If the mode control unit 152-3 determines in step S1620 that the RAM mode is selected, then in step S1630 the command buffer 154 disables the erase operation. Namely, mode control unit 152-3 generates a logic low flash mode signal MRS_FLASH and in response, the command buffer 154 generates a logic low erase signal ERS. And, if the mode control unit 152-3 determines in step S1640 that the pre-read operation is enabled, then in step S1650 the write circuit 112-3 only writes write data WDATA in memory locations addressed by the write address WADDR of the memory cell array 102 that do not store data matching the write data WDATA. Namely, the mode control unit 152-3 generates a logic high pre-read enable signal MRS_READ, and the multiplexers 1502 and 820 in the write circuit 112-3 enable the write driver 830 based on output from the comparator 1504. As will be appreciated from the above-description, in response to the pre-read enable signal MRS_READ indicating the pre-read operation is enabled, the read circuit 110 reads the data stored in the memory cell array 102 at the memory locations addressed by the address or addresses output from the address buffer 120. If, however, the mode control unit 152-3 determines in step S1640 that the pre-read operation is not enabled, then in step S1660 the write circuit 112-3 writes the write data WDATA in the memory cell array 102 at the memory locations addressed by the write address WADDR.

If the mode control unit 152-3 determines in step S1620 that the flash mode is selected, then in step S1670 the command buffer 154 determines if an erase operation is selected. If the erase operation is selected and the mode control unit 152-3 determines in step S1680 that the pre-read operation is enabled, then in step S1690 the write circuit 112-3 only writes erase data (i.e., logic "1") in the memory locations of the memory cell array 102 storing logic "0". Namely, memory locations addressed by the erase addresses ERADDR already storing a logic "1" are not over-written with a logic "1". In particular, the mode control unit 152-3 outputs a logic high pre-read enable signal MRS_READ and a logic high flash mode signal MRS_FLASH, while the command buffer 154 outputs a logic high erase enable signal ERS. In response, the multiplexers 1502 and 820 supply the output of the comparator 1504 to the write driver 830 as the enable signal.

If the mode control unit 152-3 determines that the pre-read operation has not been enabled in step S1680, then in step S1700 the write circuit S1700 writes the erase data in the memory locations addressed by the erase addresses ERADDR. In particular, while a logic high flash mode signal MRS_FLASH and erase enable signal ERS are generated, a logic low pre-read enable signal MRS_READ is generated. Consequently, the multiplexers 1502 and 820 supply the power supply voltage VCC as the enable signal for the write driver 830.

Returning to step S1670, if the command buffer 154 determines that the erase operation is not enabled, then in step S1710 the write circuit 112 writes only the logic low or logic "0" data of the write data WDATA into the memory cell array 102.

As will be appreciated from the forgoing description, the embodiment of FIG. 14 may also be modified consistent with the embodiment of FIGS. 10 and 13 described above.

Figure 17:
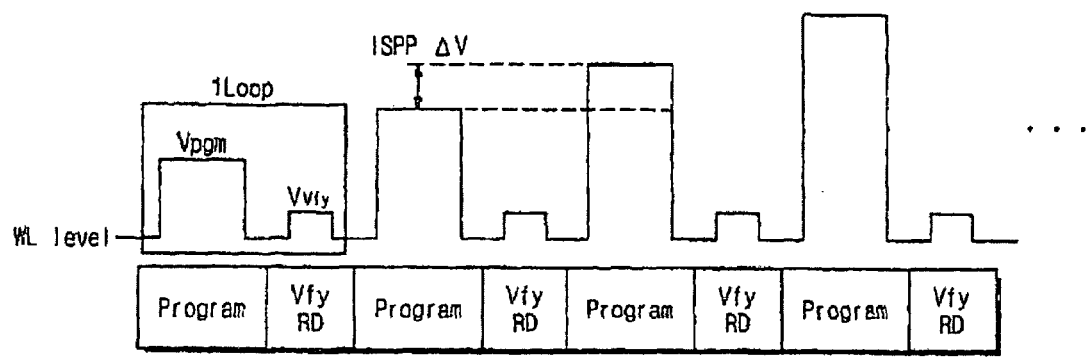
FIG. 17 illustrates a program loop including a plurality of unit program loops using an ISPP method.

It will further be appreciated that the write operation in any of the above embodiments may be performed according to an incremental program pulse (ISPP) method as shown in FIG. 17. In particular, FIG. 17 illustrates a program loop including a plurality of unit program loops using an ISPP method. As illustrated in FIG. 17, one unit program loop may include a program operation and a verify read operation. In the program operation, a program voltage or voltage waveform Vpgm may be applied to a selected word line. While shown as a simple square wave, it will be appreciated that the program voltage waveform may be of a shape to either set or reset the phase change material in the memory cell Cp. In the verify read operation, a verify voltage Vvfy may be applied to the selected word line and a read voltage Vread may be applied to the unselected word lines. In ISPP fashion, the program voltage Vpgm may be increased by a delta voltage for each unit program loop. Once the verify read operation verifies that data has been properly written, the program loops ends, and the write operation ends. Namely, until verified the write operation is not complete.

It will be understood that FIG. 17 is but one example method of ISPP and that any ISPP method may be used to in the write operation.

Still further, it will be appreciated that the memory cells Cp may serve as multi-level cells (MLC). Here instead of just the set and reset states, the memory cell Cp may be programmed to states between the set and reset state such that the memory cell Cp stores more than 1 bit of data. For example, if four states exist, each state may represent two bits of data.

Furthermore, the present invention is not limited to any particular cell array structure, or use of a particular cell array structure with a particular resistance material based memory. Instead, any cell structure such as 3D, crosspoint, wafer stack, etc. may be implemented in the embodiments of the present invention. U.S. Pat. No. 6,351,406 discloses such an example cell structure, and is incorporated by reference herein in its entirety.

Application Embodiments

Figure 18:
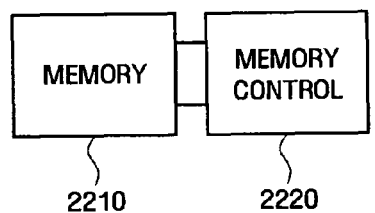
FIGS. 18-23 illustrate example embodiments of applications of the semiconductor device.

FIG. 18 illustrates an example embodiment of an application of the semiconductor device. As shown, this embodiment includes a memory 2210 connected to a memory controller 2220. The memory 2210 may be any of the semiconductor device embodiments described above. The memory controller 2220 supplies the input signals for controlling operation of the memory 2210. For example, the memory controller 2220 supplies the command CMD and address signals.

Figure 19:
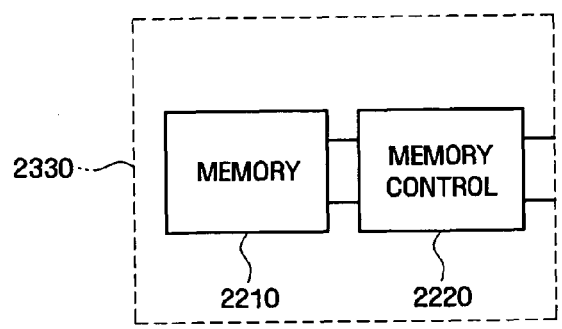

FIG. 19 illustrates yet another embodiment. This embodiment is the same as the embodiment of FIG. 18, except that the memory 2210 and memory controller 2220 have been embodied as a card 2330. For example, the card 2330 may be a memory card such as a flash memory card. Namely, the card 2330 may be a card meeting any industry standard for use with a consumer electronics device such as a digital camera, personal computer, etc. It will be appreciated that the memory controller 2220 may control the memory 2210 based on controls signals received by the card 2330 from another (e.g., external) device.

Figure 20:
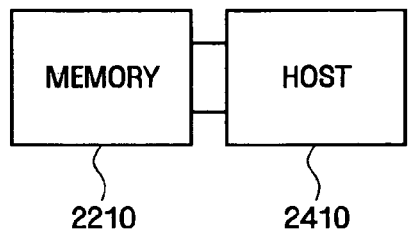

FIG. 20 illustrates a still further embodiment of the present invention. As shown, the memory 2210 may be connected with a host system 2410. The host system 2410 may be a processing system such as a personal computer, digital camera, etc. The host system 2410 may use the memory 2210 as a removable storage medium. As will be appreciated, the host system 2410 supplies the input signals for controlling operation of the memory 2210. For example, the host system 2410 supplies the command CMD and address signals.

Figure 21:
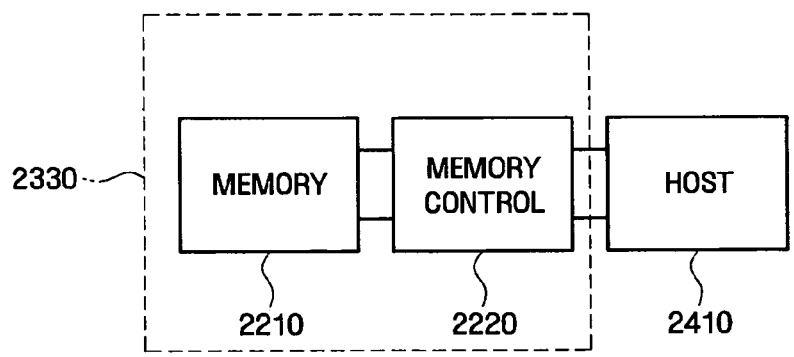

FIG. 21 illustrates an embodiment of the present invention in which the host system 2410 is connected to the card 2330 of FIG. 19. In this embodiment, the host system 2410 applies control signals to the card 2330 such that the memory controller 2220 controls operation of the memory 2210.

Figure 22:
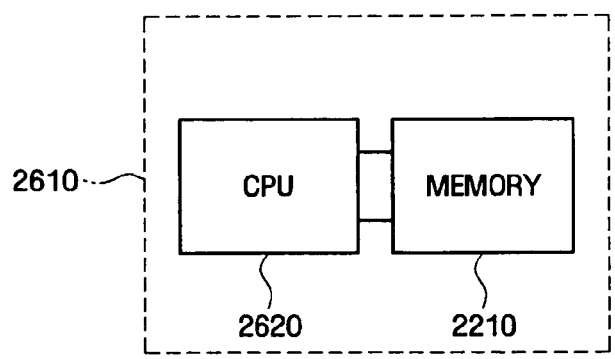

FIG. 22 illustrates a further embodiment of the present invention. As shown, the memory 2210 may be connected to a central processing unit (CPU) 2620 within a computer system 2610. For example, the computer system 2610 may be a personal computer, personal data assistant, etc. The memory 2210 may be directly connected with the CPU 2620, connected via bus, etc. It will be appreciated, that FIG. 22 does not illustrate the full complement of components that may be included within a computer system 2610 for the sake of clarity.

Figure 23:
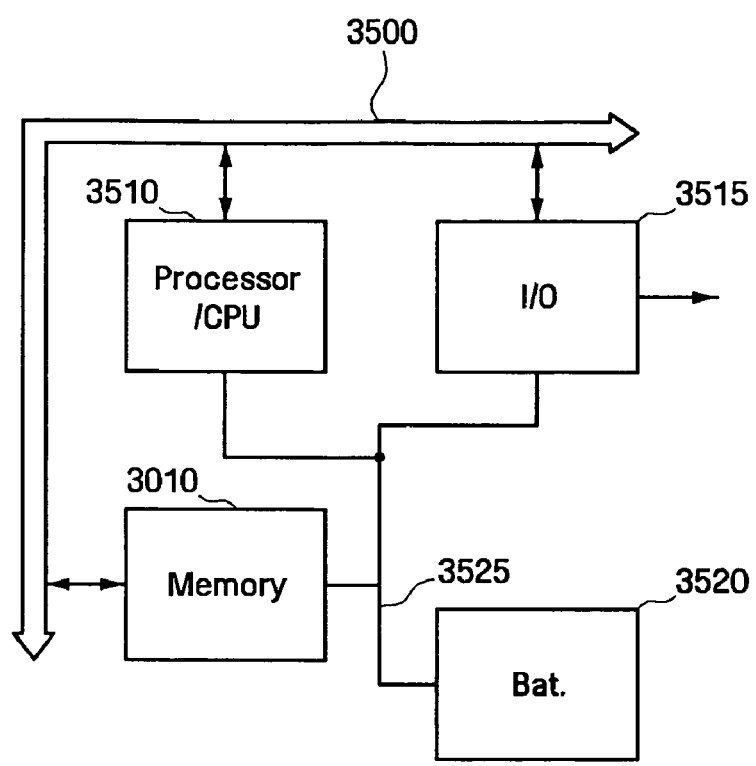

FIG. 23 illustrates another embodiment of the present invention. FIG. 23 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 23, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 23. Furthermore, the present invention is not limited to this architecture. For example, the memory 3010 may be replaced with the embodiment of FIG. 19, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

The invention being thus described, it will be obvious that the same may be varied in many ways. Such variations are not to be regarded as a departure from the invention, and all such modifications are intended to be included within the scope of the invention.

We claim:

1. A semiconductor device, comprising:
a non-volatile memory cell array;
a control unit configured to generate a mode signal indicating if a flash mode has been enabled;
a write circuit configured to write in the non-volatile memory cell array based on the mode signal such that the write circuit disables erasing the non-volatile memory cell array if the flash mode has not been enabled and instructions to erase one or more cells of the non-volatile memory cell array is received; and
a read circuit configured to read data from the non-volatile memory cell array; and wherein
the control unit is configured to control the read circuit to read data associated with an address input for a write operation during a pre-read operation; and
the write circuit is configured to disable writing data in memory locations of the non-volatile memory cell array storing data matching the write data during the pre-read operation based on the read data.

2. The semiconductor device of claim 1, wherein the control unit is configured to generate the mode signal based on input signals.

3. The semiconductor device of claim 1, wherein
the control unit is configured to generate an erase enable signal indicating whether an erase operation is enabled, the control unit is configured to generate an erase enable signal indicating the erase operation is not enabled if the mode signal indicating that the flash mode has not been enabled; and wherein
the write circuit is configured to write in the non-volatile memory cell array based on the mode signal and the erase enable signal.

4. The semiconductor device of claim 3, wherein the control unit is configured to generate the erase enable signal based on an input command and the mode signal.

5. The semiconductor device of claim 3, further comprising:
an input buffer configured to output to the write circuit one of input data and erase data based on the erase enable signal.

6. The semiconductor device of claim 1, wherein a mode control circuit is configured to change the mode signal.

7. The semiconductor device of claim 1, wherein
the non-volatile memory cell array is divided into a plurality of memory portions; and
the control unit includes,
a mode memory configured to store a flag associated with each memory portion indicating whether the flash mode applies to the memory portion;
a mode control unit configured to access a flag in the mode memory based on an input address, and configured to generate the mode signal based on the accessed flag.

8. The semiconductor device of claim 1, wherein
the control unit is configured to generate a pre-read enable signal indicating whether the pre-read operation is enabled; and
the write circuit is configured to disable the write operation if the read data matches data associated with the write operation and the pre-read enable signal indicates the pre-read operation is enabled.

9. The semiconductor device of claim 8, wherein the control unit is configured to generate the pre-read enable signal based on input signals.

10. The semiconductor device of claim 8, wherein the write circuit comprises:
a write driver configured to write data;
a comparator comparing the write data to the read data; and
at least one selector selectively supplying output of the comparator to the write driver as an enable signal based on the pre-read enable signal.

11. The semiconductor device of claim 1,
wherein the write circuit is configured to write logic '1' only in the addresses of the non-volatile memory cell array for which a logic '0' was read during the pre-read operation during an erase operation if the flash mode is enabled.

12. A semiconductor device comprising:
a non-volatile memory cell array;
a control unit configured to generate a mode signal indicating if a flash mode has been enabled, the control unit is configured to generate an erase enable signal indicating whether an erase operation is enabled, the control unit configured to generate an erase enable signal indicating the erase operation is not enabled if the mode signal indicating that the flash mode has not been enabled;
a write circuit configured to write in the non-volatile memory cell array based on the mode signal such that the write circuit disables erasing the non-volatile memory cell array if the flash mode has not been enabled and instructions to erase one or more cells of the non-volatile memory cell array is received, the write circuit configured to write in the non-volatile memory cell array based on the mode signal and the erase enable signal; and
an input buffer configured to output to the write circuit one of input data and erase data based on the erase enable signal, wherein the write circuit includes,
a selector configured to selectively output one of a fixed enable signal and an inverse of the input data as a write enable signal based on the mode signal and the erase enable signal, and
a write driver configured to write the output from the input buffer in the non-volatile memory cell array if enabled by the write enable signal, the fixed enable signal enabling the write driver if output as the write enable signal.

13. The semiconductor device of claim 12, wherein the selector is configured to output the fixed enable signal if the flash mode is enabled and the erase operation is enabled;

the selector is configured to output the fixed enable signal if the flash mode is not enabled; and the selector is configured to output the inverse of the input data if the flash mode is enabled and the erase operation is not enabled.

14. The semiconductor device of claim 13, further comprising:

an address buffer configured to generate at least one address based on at least one of an input address and the erase enable signal.

15. The semiconductor device of claim 14, wherein the address buffer generates a plurality of addresses if the erase operation is enabled.

* * * * *